(12) United States Patent
Franz et al.

(10) Patent No.: US 11,381,017 B2
(45) Date of Patent: Jul. 5, 2022

(54) HIGH CONNECTOR COUNT MATING COMPLIANCE

(71) Applicant: HEWLETT PACKARD ENTERPRISE DEVELOPMENT LP, Houston, TX (US)

(72) Inventors: John Franz, Houston, TX (US); Brian T. Purcell, Tomball, TX (US); Paul Danna, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 162 days.

(21) Appl. No.: 16/847,924

(22) Filed: Apr. 14, 2020

(65) Prior Publication Data
US 2021/0320443 A1    Oct. 14, 2021

(51) Int. Cl.
*H01R 12/00*     (2006.01)
*H01R 12/72*     (2011.01)
(Continued)

(52) U.S. Cl.
CPC ......... *H01R 12/722* (2013.01); *H01R 12/737* (2013.01); *H01R 13/518* (2013.01); *H01R 31/06* (2013.01); *H05K 1/0278* (2013.01); *H05K 1/189* (2013.01); *H05K 2201/09163* (2013.01); *H05K 2201/09227* (2013.01); *H05K 2201/10189* (2013.01)

(58) Field of Classification Search
CPC ........ H01R 12/77; H01R 12/78; H01R 12/79; H01R 12/81; H01R 12/722; H01R 12/737; H01R 13/06; H01R 13/518; H05K 1/0278; H05K 1/189; H05K 2201/09163; H05K 2201/09227; H05K 2201/10189

USPC ...................................................... 439/55, 67
See application file for complete search history.

(56) References Cited

U.S. PATENT DOCUMENTS 5,816,861 A * 10/1998 Cheng .................. H01R 12/722
                                                     439/653
6,162,099 A * 12/2000 Wu ......................... H01R 31/06
                                                     439/638
(Continued)

OTHER PUBLICATIONS

ExaMAX® IO Connector System, (Web Page), Retrieved Oct. 25, 2019, 2 Pgs.

*Primary Examiner* — Khiem M Nguyen
(74) *Attorney, Agent, or Firm* — Nolte Intellectual Property Law Group

(57) ABSTRACT

A method and system are disclosed that allow easier coupling between high-density connectors. In one example implementation, the connectors on a computer board are mounted on flexible tabs extending from the computer board, the tabs having been formed by cutting slots on both sides of each of the tabs. A milled section within each tab makes the tab thinner, allowing it additional flexibility. In another example implementation, a pass-through connector is used as an intermediary between two mating connectors. The pass-through connector has internal pins with greater tolerance than the tolerance between the two mating connectors, allowing it easier alignment of pins for coupling. In yet another example implementation, mating connectors are coupled using a bundle of cables between the mating connectors that allows the coupling of multiple connectors, one at a time, reducing or eliminating the need to simultaneously couple multiple connectors.

20 Claims, 9 Drawing Sheets

(51) Int. Cl.
*H05K 1/18* (2006.01)
*H05K 1/02* (2006.01)
*H01R 31/06* (2006.01)
*H01R 12/73* (2011.01)
*H01R 13/518* (2006.01)

(56) References Cited

U.S. PATENT DOCUMENTS

| | | |
|---|---|---|
| 6,616,342 B2 | 9/2003 | Kiani |
| 6,682,230 B1 | 1/2004 | Demangone et al. |
| 7,059,907 B2 | 6/2006 | Winings et al. |
| 7,603,040 B2 | 10/2009 | Vogley |
| 9,017,087 B1 | 4/2015 | Rossman |
| 10,136,196 B2 | 11/2018 | Ritter et al. |
| 2015/0311612 A1* | 10/2015 | Qiao .................... H01R 12/716 439/607.01 |
| 2019/0098778 A1* | 3/2019 | Pandey ................ H05K 5/0065 |
| 2020/0036124 A1* | 1/2020 | Tsai ..................... H01R 12/716 |

* cited by examiner

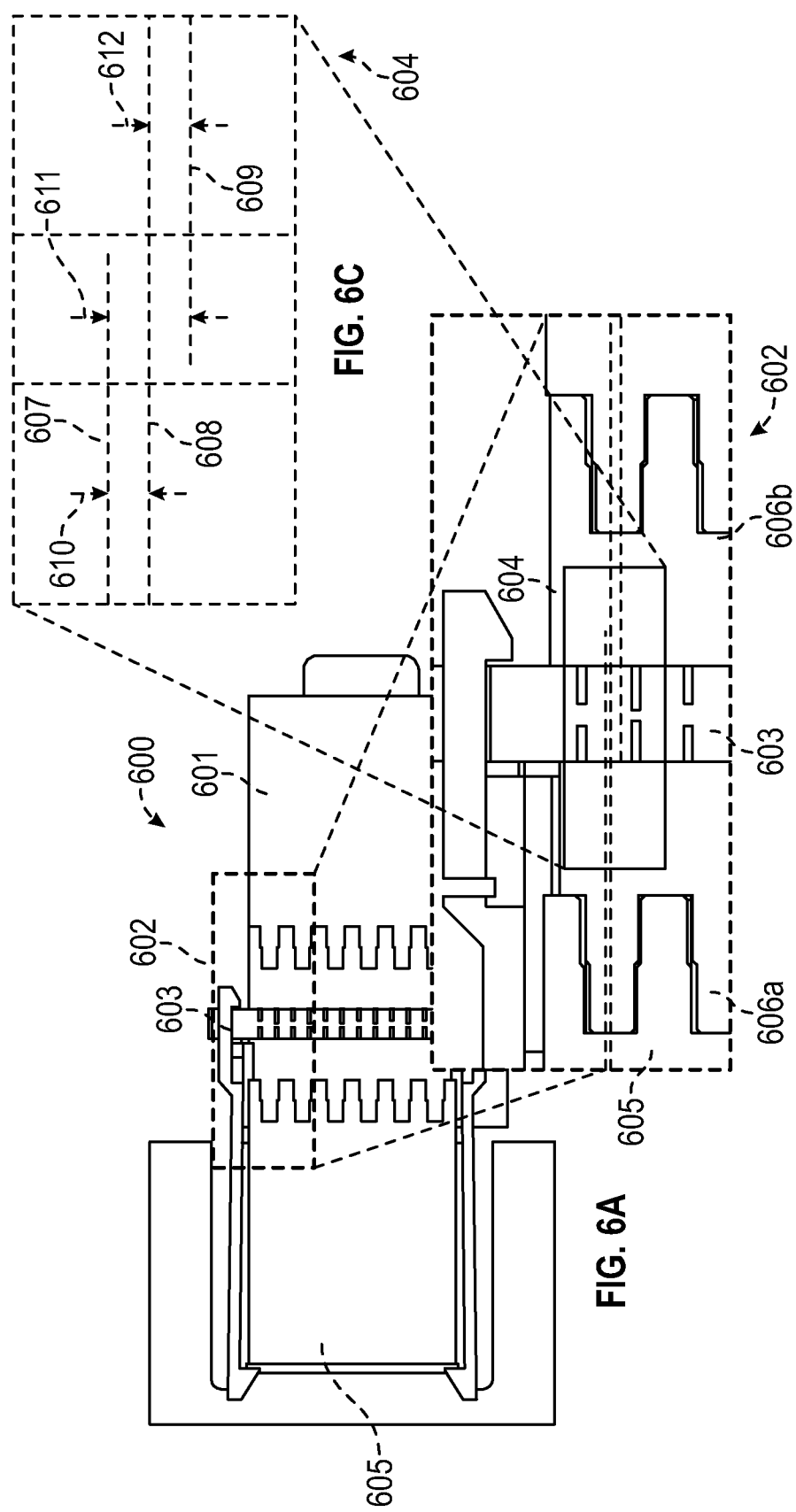

HIGH CONNECTOR COUNT MATING COMPLIANCE

BACKGROUND

With the ubiquity of computers in most fields and the commensurate increase in complexity of electronics and software, there is a corresponding increase in data transfer and communications across electronic systems, servers, and boards. Most wired data transfer is generally done via connectors. One way to increase communication speed is to use parallel signals, which results in a greater number of connectors, each connector having a relatively greater number of and/or higher density of signal pins. This is particularly applicable to servers, which have a central role in serving applications and data files from many client systems. As the number of connectors and their signal densities increase, simultaneously aligning and coupling two mating connectors becomes more difficult. For example, it is more difficult to simultaneously align and plug together two computer server boards with eight mating connectors each, with each connector having 30 pins (8×30=240 pins total per board) than doing the same with two connectors per board with 12 pins each (2×12=24 pins total per board).

BRIEF DESCRIPTION OF THE DRAWINGS

The present disclosure is best understood from the following detailed description when read with the accompanying Figures. It is emphasized that, in accordance with the standard practice in the industry, various features are not drawn to scale. In fact, the dimensions of the various features may be arbitrarily increased or reduced for clarity of discussion.

FIG. 6A is a plan, sideview of a first connector and its respective pins mating a second connector and its respective pins via a pass-through flexible connector, according to one or more examples of the disclosure.

FIG. 6B is a closeup view of the pins of the first connector and the pins of the second connector coupled together via the pass-through connector and the differences between tolerances of the first and the second connectors and the pins of the pass-through flexible connector, according to one or more examples of the disclosure.

FIG. 6C is a closeup view of the expanded tolerances provided by the pass-through flexible connector with respect to the first connector and the second connector, according to one or more examples of the disclosure.

DETAILED DESCRIPTION

Figure 1:
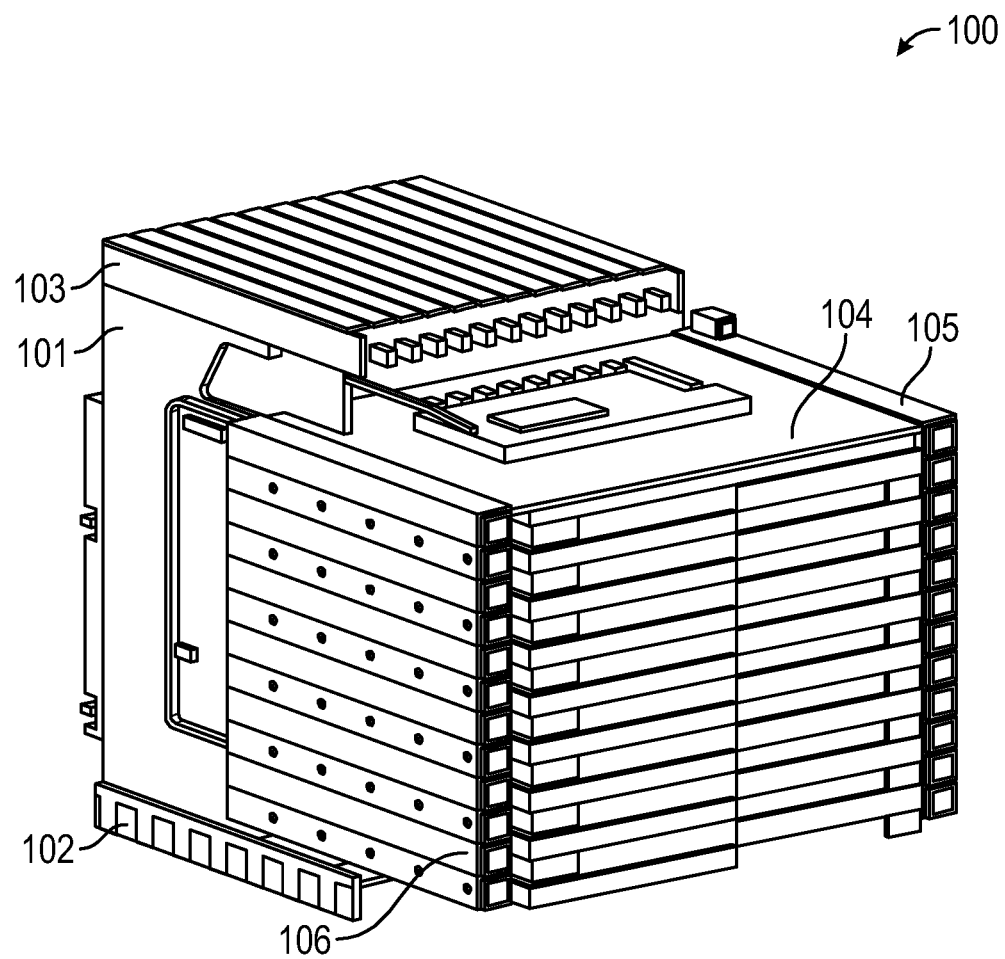
FIG. 1 depicts a computer chassis housing a number of electronic boards plugged therein, according to one or more examples of the disclosure.

Illustrative examples of the subject matter claimed below will now be disclosed. In the interest of clarity, not all features of an actual implementation are described in this specification. It will be appreciated that in the development of any such actual implementation, numerous implementation-specific decisions may be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

Further, as used herein, the article "a" is intended to have its ordinary meaning in the patent arts, namely "one or more." Herein, the terms "about" and "approximately" when applied to a value generally means within the tolerance or precision range of the equipment used to produce the value, or in some examples, means plus or minus 10%, or plus or minus 5%, or plus or minus 1%, unless otherwise expressly specified. Further, herein the term "substantially" as used herein means a majority, or almost all, or all, or an amount with a range of about 51% to about 100%, for example. Moreover, examples herein are intended to be illustrative only and are presented for discussion purposes and not by way of limitation.

It will be appreciated that even though in the present disclosure the term "computer board" is used, the concepts, systems, and methods described may be equally applicable to other related areas such as other digital and analog electronic boards, optical equipment, and the like. It will be further appreciated that even though in the associated drawings the disclosed structures and techniques, such as the structure of connectors and the methods of mating the connectors, are shown for only one or a few connectors for simplicity and clarity, such structures and techniques apply to all connectors on the computer boards in a given configuration. For example, a pass-through flexible connector (see FIG. 3C) may be shown for one connector on a computer board but all connectors on that computer board include a pass-through flexible connector.

Briefly described, methods and systems are disclosed that allow easier and more reliable coupling between high pin or receptor count, high-density connectors, relative to not using these methods and systems. In one example implementation, the connectors on a computer board are mounted on flexible tabs extending from the computer board. The tabs may be formed by cutting slots in the board, for example, using a milling machine, on both sides of each of the tabs to separate each tab on its sides from the board, giving it flexibility relative to the board. Additionally, a milled section within each tab makes the tab thinner, allowing it additional flexibility.

In another example implementation, a pass-through connector is used as an intermediary between two mating connectors on two mating boards. The addition of the pass-through connector assembly enables increased tolerance (for example, double the tolerance), compared with the two original mating connectors, allowing it easier alignment of pins for coupling.

In yet another example implementation, mating connectors are coupled using a bundle of cables between the mating connectors that allows the coupling of multiple connectors, one at a time, reducing or eliminating the need to couple multiple connectors simultaneously. In effect, there is an increased allowance in tolerance due to the independent compliance of each connector interface. In this configuration, eventually all connectors on one board are mated with their corresponding or mating connectors on a mating board, but the process of mating the connectors together is performed one connector at a time because connectors attached to cables are not held in a rigid position with respect to each other and their respective mating connectors and cannot be simultaneously mated.

FIG. 1 shows a computer chassis 100 housing a number of computer boards 101 and 104 plugged therein, according to one or more examples of the disclosure. In one example implementation, computer boards 101 and 104 are plugged into or coupled other boards to transfer data between different computing modules. Computer boards 101 may be bound or guided into position by rail guides 102 and 103 on a vertical part (with respect to the figure) of the computer chassis 100. Similarly, computer boards 104 may be bound or guided into position by rail guides 105 and 106 on a horizontal part (with respect to the figure) of the computer chassis 100.

In some implementations, a backplane may be used as a data communication or transmission path, such as a bus like Peripheral Component Interconnect (PCI), PCI Industrial Computer Manufacturing Group (PICMG), PCI extended (PCIX), and the like in various computing platforms. Generally, a backplane is a board with connectors on one side into which other computer boards are plugged in. A midplane is a board with connectors on both sides into which other computer boards are plugged in. In this example implementation, no backplane or midplane is needed for the computer boards to be plugged into. Instead, boards are coupled directly together for data exchange without an intermediary backplane or midplane. Direct connection, generally reduces the number of system components and indirect or intermediate contacts in the data transmission path, thus, increasing reliability and performance. Reliability is generally increased because there are fewer components and contacts that can fail. Performance may be improved due to shorter length of the data transmission path and thus, lower impedance and latency. Although most backplane and midplane boards have long slotted connectors into which a board is plugged into, in some example implementations, a backplane or midplane may be adapted to benefit from the systems and methods disclosed herein.

However, as noted above, direct connection between multiple high-count (large number of pins or receptors, on the order of tens or hundreds per connector) connectors on the computer boards 101 and 104 includes simultaneous contact between many pins, on the order of hundreds of pins, and corresponding receptors. With tight tolerances needed to create good electrical and stable mechanical contacts between the pins and the receptors, simultaneous alignment of the pins and receptors may become challenging. The physical force needed to install a board in the computer chassis 100 by inserting the pins in the corresponding receptors can also be considerable, adding to the difficulty of direct connection between the mating boards. The installation issues of alignment and insertion force are further addressed below. The present disclosure presents a solution that helps to mitigate these issues. In real and practical systems, mating boards may each have hundreds, for example, 300-500 connectors, each having hundreds of pins, for example, 150-300 pins, making simultaneous connections of tens of thousands of pins difficult due to precise pin alignment requirements.

Figure 2A:
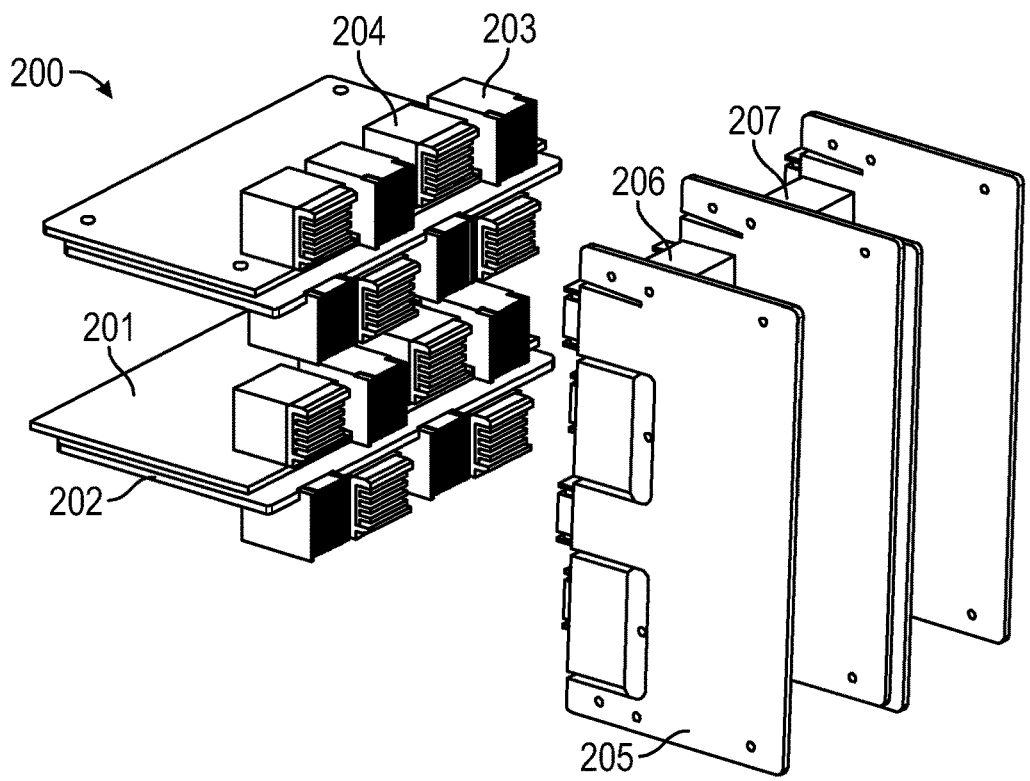
FIG. 2A is a perspective, left view of two sets of direct-mating computer boards in horizontal and vertical orientations, according to one or more examples of the disclosure.

FIG. 2A is a left view 200 of two sets of direct-mating computer boards 201, 202, and 205 in horizontal and vertical orientations, according to one or more examples of the disclosure. In an example implementation, the arrangement of the computer boards 201, 202, and 205 and the placement of their respective high-count connectors 203, 204, 206, 207 allow a spatially dense concentration of connectors and hence dense and high data transmission rate, which is generally desirable in computing systems. This figure shows a simplified example of an overall computer system depicting the major components and board orientations and how they fit together. Real and practical systems may have hundreds of connectors that are simultaneously mated.

In this arrangement, computer board 201 and 202 have their respective connectors on one surface of the board. The opposite flat surfaces of the boards, which do not have connectors installed on them, face and touch each other, with their respective connectors facing away on their opposite surfaces, as shown in FIG. 2A. So, computer boards 201 and 202 are placed adjacent to each other and have their connectors on top and bottom, with respect to the orientation shown in the figure.

The high-count connectors 203, 204, 206, and 207 are alternated on the computer boards, with every other connector being a male (with pins) and a female (with receptors), as shown in darker and lighter shades and different orientations in the figure. This configuration of alternating male and female connectors provide a symmetry of connectivity that allows the same boards to be used in front (or horizontal) or back (or vertical) parts of the computer chassis 100 (see FIG. 1). This arrangement allows the same boards to be used in any configuration rather than having different computer boards for different chassis or server configurations. In this arrangement, the computer boards may be flipped or rotated around any of its axis and still be able to connect to another similar board. In other example implementations, the male and female connectors may be arranged differently while still providing symmetry of connectivity. For example, there could be two male connectors followed by two female connectors, or four male connectors followed by four female connectors, or other arrangements that result in symmetrical connectivity.

The computer boards 201, 202, and 205 are interchangeable with respect to connectivity (but not necessarily with respect to the functions of the boards). Computer boards 201 and 202 are shown in horizontal orientation (as shown in FIG. 2A) and the mating computer board 205 (and others) are shown in vertical orientation. The positions of the computer boards 201, 202, and 205 may alternatively be specified as being orthogonal with respect to the corresponding mating board. This way, in each of the horizontal and vertical parts of the computer chassis 100, there are horizontally installed boards and vertically installed boards, respectively.

The horizontally orientated computer boards 201 and 202 may face up or down, again the up/down orientation being with respect to the other computer boards. For example, computer board 201 is facing up (surface on which connectors are installed) and computer board 202 is facing down, with respect to computer board 201. And computer boards 201 and 202 are both horizontally oriented with respect to computer board 205, which is vertically oriented. Similarly, the vertically oriented computer board 205 is facing right, while some of the other vertically oriented computer boards are facing left (for example, the vertical computer board with high-count connector 206), with respect to computer board 205.

Figure 2B:
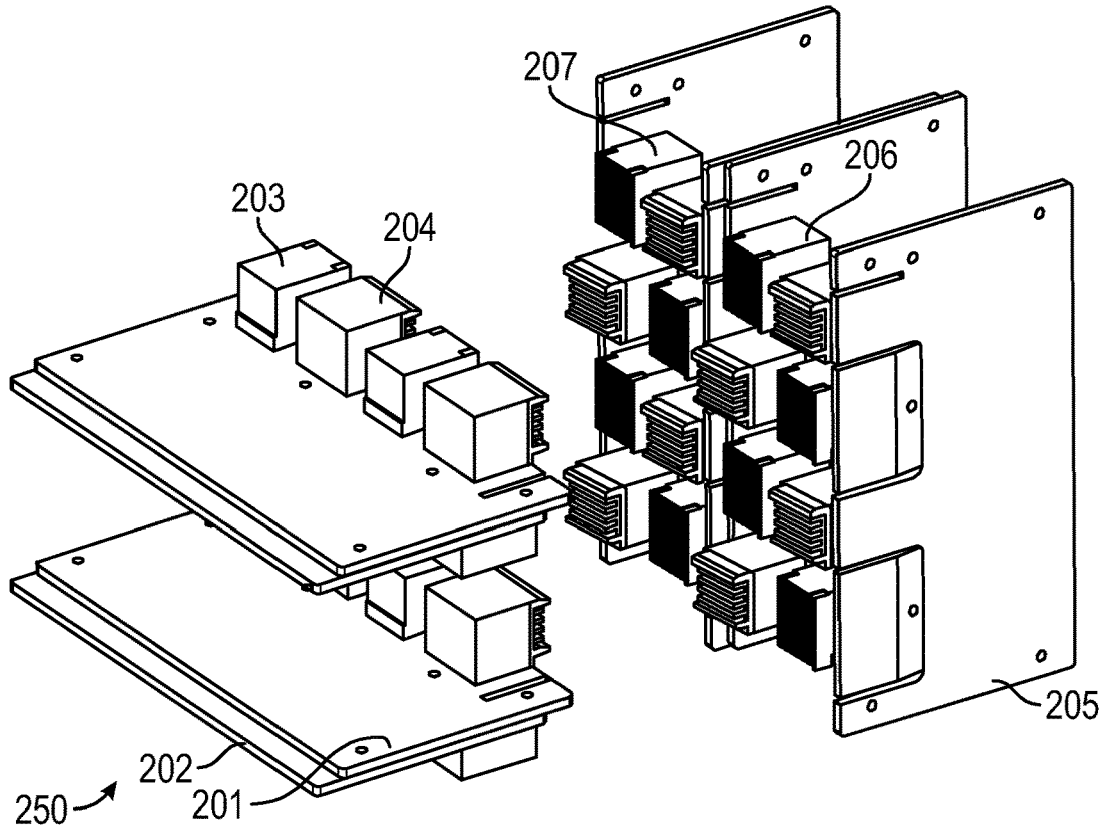
FIG. 2B is a perspective right view of two sets of direct-mating computer boards in horizontal and vertical orientations, according to one or more examples of the disclosure.

FIG. 2B is a perspective, right view 250 of two sets of direct-mating computer boards in horizontal and vertical orientations, according to one or more examples of the disclosure. The perspective right view 250 shows the same computer board arrangement of FIG. 2A from a different perspective to more clearly show the relationship between the horizontal and vertical banks of boards and how they are related to each other spatially and geometrically, as already described in detail with respect to FIG. 2A.

Figure 3A:
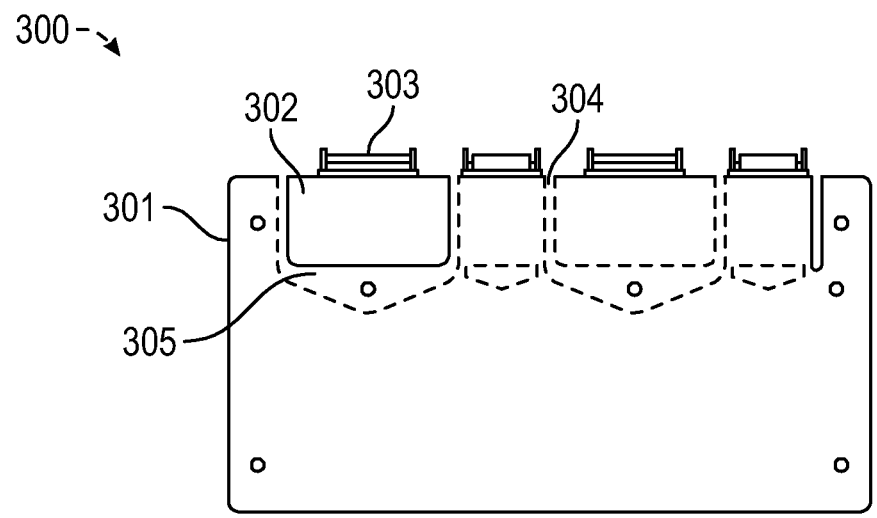
FIG. 3A depicts a computer board with flexible connector tabs, according to one or more examples of the disclosure.

FIG. 3A shows a computer board 300 with flexible connector tabs 302, according to one or more examples of the disclosure. In an example implementation, the computer board 300 includes a PCB substrate 301, flexible connector tabs 302, connectors 303, slots 304, and a milled portion 305.

In an example implementation, connector 303 is mounted on one surface of the PCB substrate 301. A flexible connector tab 302 is partially separated from the PCB substrate 301 by creating slots 304 on either side thereof. By virtue of being partially separated from the PCB substrate 301, flexible connector tab 302 becomes more flexible by being detached from the PCB substrate 301. This way, flexible connector tab 302 may flex or bend up and down with respect to the plane of the rest of the PCB substrate 301, hence allowing the connector 303 mounted thereon to be more easily repositioned to align with a mating connector.

The flexibility of flexible connector tab 302 may be enhanced by milling a portion, for example, milled portion 305 of the flexible connector tab 302 to make it thinner and more easily bendable. A small amount of flexing or bending by flexible connector tab 302 and the attached connector 303, may make a significant difference in aligning connector pins and corresponding receptors for plugging them into each other.

Figure 3B:
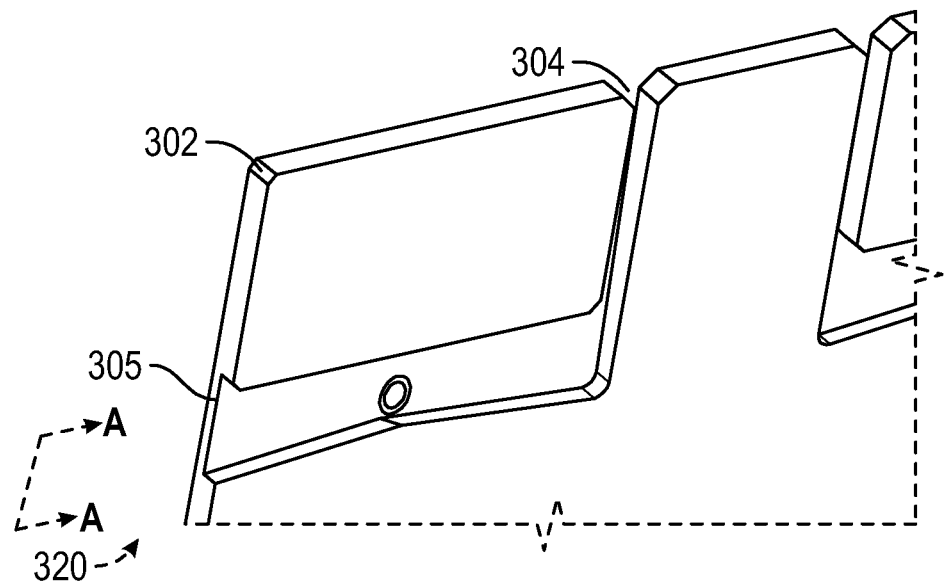
FIG. 3B is a closeup of the flexible connector tab of the computer board of FIG. 3A, according to one or more examples of the disclosure.

FIG. 3B is a closeup 320 of the flexible connector tab 302 of the computer board 300 of FIG. 3A, according to one or more examples of the disclosure. In one example implementation, the milled portion 305 is similar to a shallow channel cut into the PCB substrate 301, which is also a part of flexible connector tab 302. The A-A section is described in further detail below. As noted above with respect to FIG. 3A, the milled section 305 creates a thinner section in the PCB substrate 301 and flexible connector tab 302 allowing more flexibility of flexible connector tab 302 with less applied force because for the same amount of bending force applied a thinner section of a material will deflect (bend) more than a thicker section of the same material having the same geometric cross section (for example, rectangular in this case). In some example implementations, the milled portion 305 may be omitted.

The thinner milled section 305 is generally cut at the base of flexible connector tab 302 to allow deflection of flexible connector tab 302 and the connector installed thereon for easier alignment of pins and receptors with a mating connector.

Figure 3C:
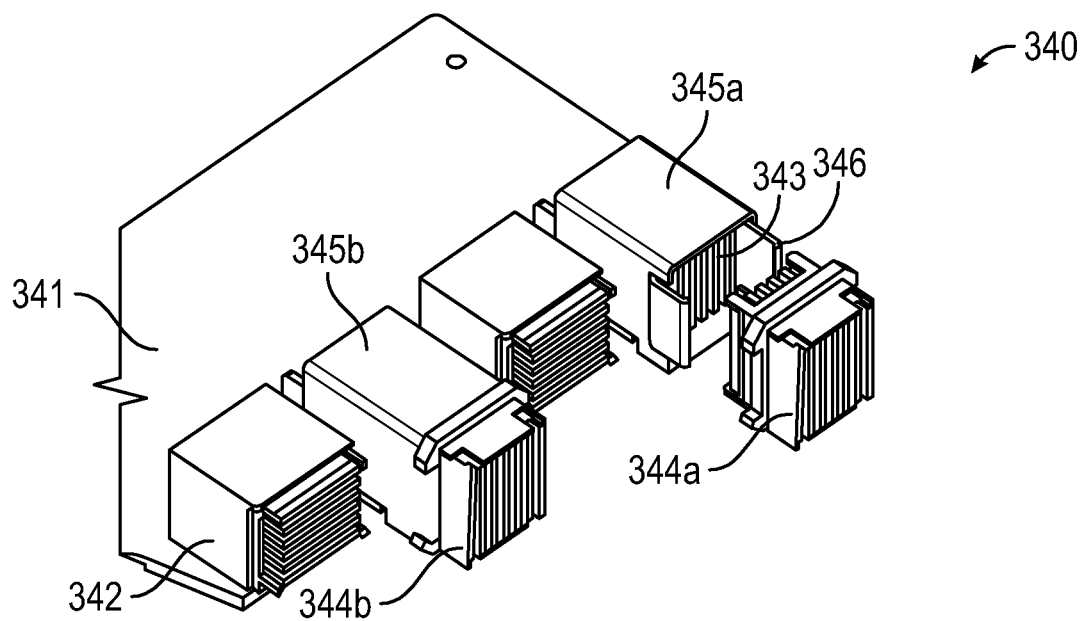
FIG. 3C shows a configuration with a pass-through flexible connector used with the computer board similar to that of FIG. 3A, according to one or more examples of the disclosure.

FIG. 3C shows a configuration 340 with a pass-through flexible connectors 344a and 344b used with the computer board 341 similar to that of FIG. 3A, according to one or more examples of the disclosure. The configuration includes connectors 342 and 343 attached to computer board 341 and the pass-through flexible connectors 344a to be coupled with connector 343. Pass-through flexible connector 344b is similar to pass-through flexible connector 343a but shown in mated position. It also includes plastic retainers 345a and 345b with plastic clamps 346 to create and maintain a rigid coupling between two directly engaged connectors, such as connectors 343 and pass-though flexible connectors 344a.

In one example implementation, connector 343 may be coupled with a corresponding mating connector on a corresponding computer board indirectly via the pass-through flexible connector 344a. In effect, the pass-through flexible connector 344a increases the tolerance between the pins or receptors of connector 343 and the receptor or pins of the corresponding mating connector on the corresponding computer, as further described below with respect to FIGS. 6A-6C.

In an example implementation, the connector 343 is enclosed by a plastic retainer that retains the coupling between the pass-through flexible connector 344a and the connector. The plastic retainer may use flexible plastic clamps 346 to stay in position with respect to the two connectors. This arrangement allows the mating connectors to stay in position without being anchored, to the computer chassis 100 (see FIG. 1), for example to a wall or other structural member of the computer chassis 100, for rigidity and stability. In an example implementation, the plastic retainers may be applied to every other connector 343 on the computer board 341. This way all connectors 343 are secured by a corresponding plastic retainer. With two mating boards, having plastic retainers on every other connector on each of the mating computer boards allows the connectors 343 to be assembled closer to each other and increase spatial density and reduce the size of the mating computer boards. This arrangement also creates a configuration symmetry that allows a single board type and configuration to be used in every slot in the computer chassis 100, regardless of orientation, up, down, left, or right with respect to other adjacent or mating computer boards. This is because half of the plastic retainers are placed on every other connector 343 on each mating computer board 361 and 362 and together all connectors on all mating computer boards are coupled with a plastic retainer.

Figure 3D:
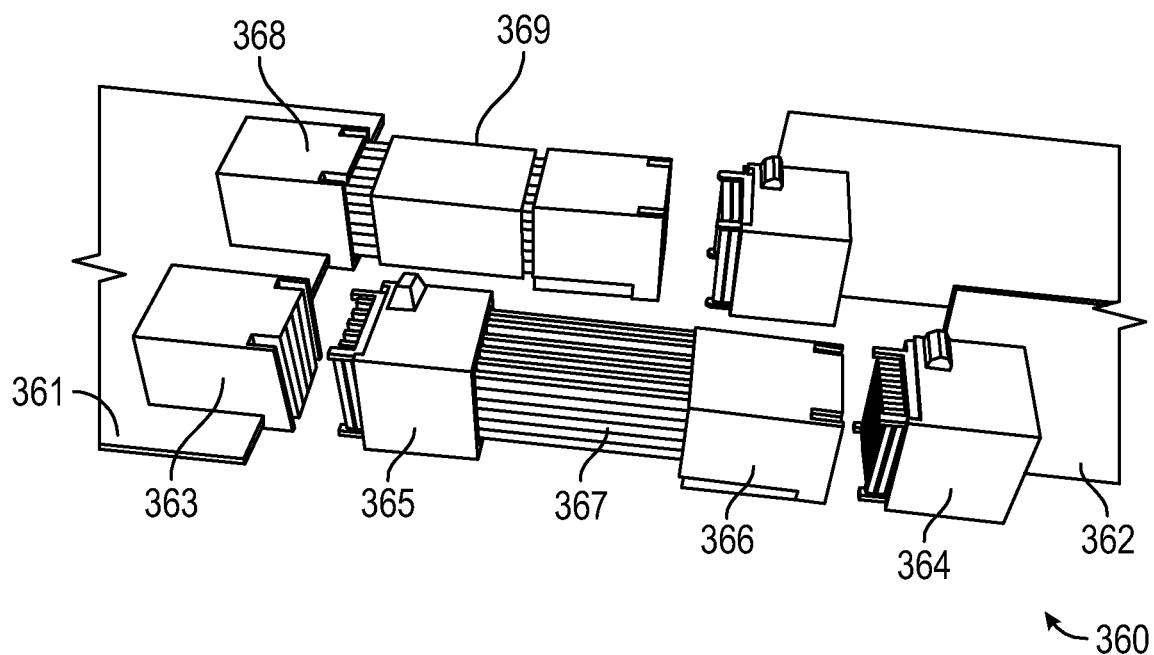
FIG. 3D shows a configuration with a cable-based flexible connector assembly used with the computer board similar to that of FIG. 3A, according to one or more examples of the disclosure.

FIG. 3D shows a configuration 360 with a cable-based flexible connector assembly used with the computer board 361 similar to that of FIG. 3A, according to one or more examples of the disclosure. In one example implementation, the configuration 360 includes a connector 363 attached to computer board 361 to be coupled with a cable-based flexible connector assembly having a first connector 365 attached to a cable bundle 367, in turn attached to a second connector 366 to be coupled with a mating connector 364 attached to a corresponding computer board 362. The bundle of cables may be wrapped in a shield or wrap 369. In another example implementation, the cabled based flexible connector is integrated with computer board 361, replacing both connectors 363 and first connector 365 with integrated connector 368.

In the integrated configuration, the length of the cable-based flexible connector assembly is reduced by the same amount as the length of the first connector 365, also increasing the reliability of the connection between computer boards 361 and 362. This configuration is further described below with respect to FIG. 7.

Figure 4A:
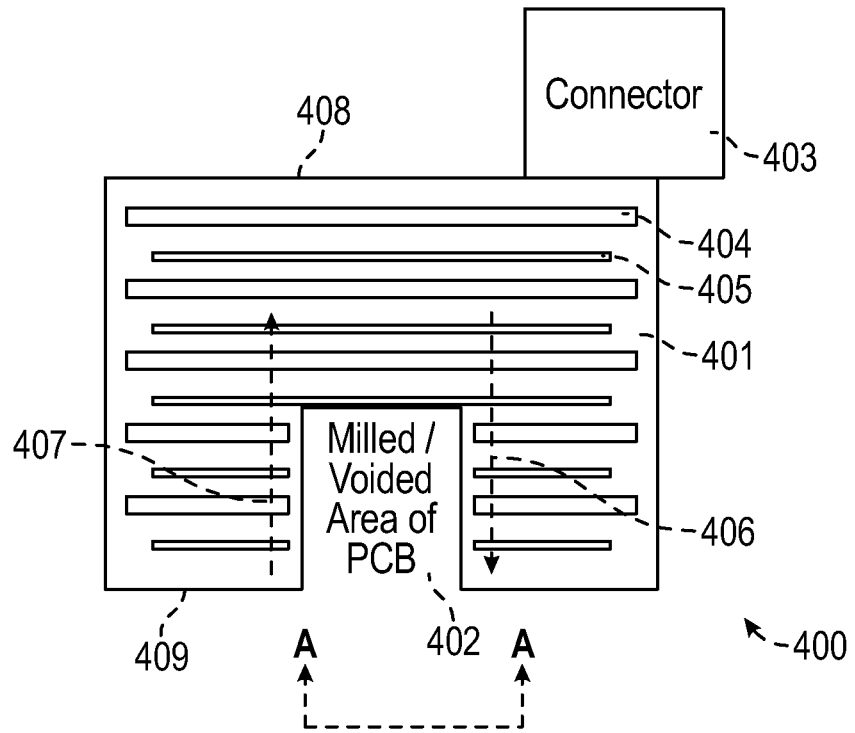
FIG. 4A depicts a computer board tab profile having a milled portion of its printed circuit board (PCB) base, according to one or more examples of the disclosure.

FIG. 4A shows a computer board tab profile 400 having a milled portion 402 of its base PCB 401, according to one or more examples of the disclosure. In an example implementation, the base PCB 401 includes attached connector 403 to a first surface 408 of base PCB 401, power and ground traces 404, signal traces 405 embedded within the base PCB 401, and transverse passages 406 and 407. Milled portion 402 may be created in a second surface 409 of base PCB 401.

In an example implementation, the computer board tab profile 400 shows the A-A section of FIG. 3B, which is a side view of the thickness of base PCB 401. As noted earlier, the milled portion 402 adds to the flexibility of the tab on which connector 403 is mounted.

The milled portion 402 is similar to a channel dug into the thickness of the base PCB 401. The depth of the channel being approximately 10%-35% of the thickness of the PCB board. In order not to interfere or destroy electrical power and ground traces 404 and signal traces 405 embedded within the base PCB 401 in one or more layers, the milled portion 402 has to be devoid of such electrical traces, such as power and ground traces 404 and signal traces 405. Hence, the electrical power and ground traces 404 and signal traces 405 may be routed around the milled portion 402 by passing them up and down around it using the transverse passages 406 and 407, also called vias in the art.

Figure 4B:
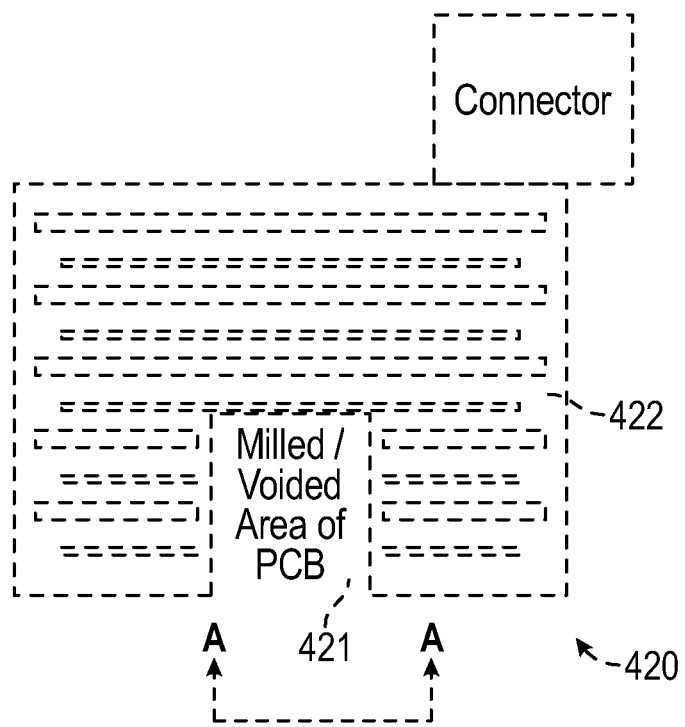
FIG. 4B shows a computer board tab profile having a milled portion a middle section of its base printed circuit board (PCB) on an opposite side (surface) of the PCB as a connector of the computer board, according to one or more examples of the disclosure.

FIG. 4B shows a computer board tab profile 420 having a milled portion 421 in a middle section of its base PCB 422 on an opposite side (surface) of the base PCB 422 as a connector of the computer board, according to one or more examples of the disclosure. This configuration is similar to the general configuration shown in FIG. 4A, with the milled portion 421 being specifically located the opposite surface of the base PCB 422 as the connector 403.

Figure 4C:
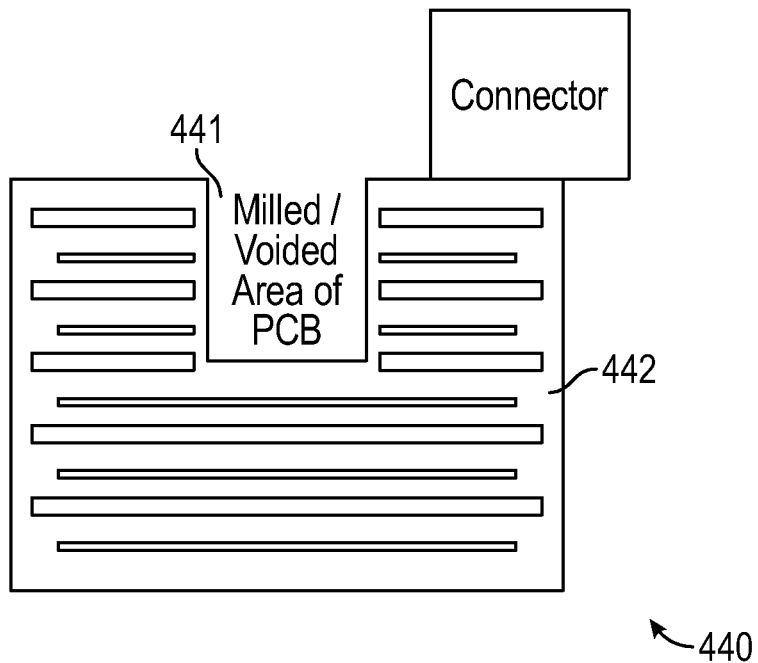
FIG. 4C depicts a computer board tab profile having a milled portion a middle section of its base PCB on a same side (surface) of the PCB as a connector of the computer board, according to one or more examples of the disclosure.

FIG. 4C shows a computer board tab profile 440 having a milled portion 441 a middle section of its base PCB 442 on a same side (surface) of the PCB as a connector of the computer board, according to one or more examples of the disclosure. This configuration is similar to the general configuration shown in FIG. 4A, with the milled portion 441 being specifically located on the same surface of the base PCB 442 as the connector 403.

Figure 4D:
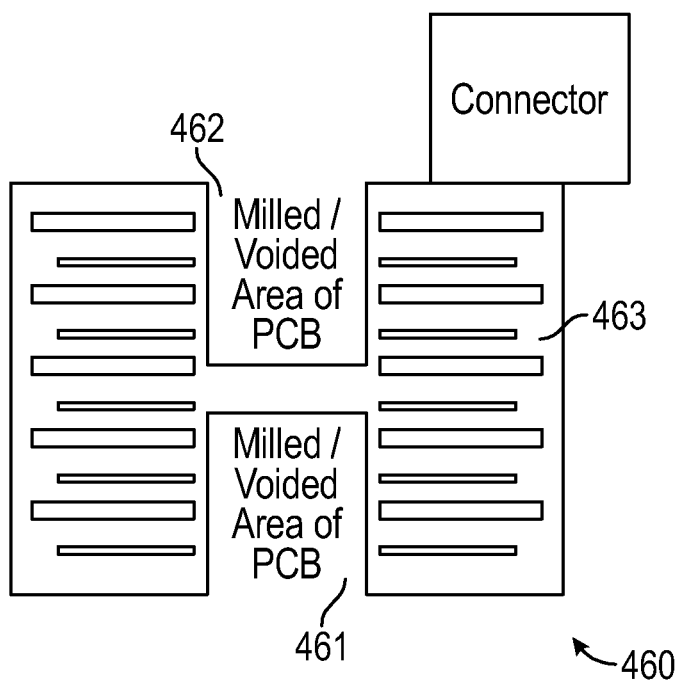
FIG. 4D shows a computer board tab profile having a milled portion a middle section of its base PCB on both a same side (surface) and an opposite side of the PCB as a connector of the computer board, according to one or more examples of the disclosure.

FIG. 4D shows a computer board tab profile 460 having two milled portions 461 and 462 in a middle section of its base PCB 463 on both a same side (surface) and an opposite side of the PCB as a connector of the computer board, according to one or more examples of the disclosure. This configuration is similar to the general configuration shown in FIG. 4A, with the milled portions 461 and 462 being specifically located on both the same surface and the opposite surface of the base PCB 463 as the connector 403. This configuration provides more flexibility of the tab-mounted connector as well as more symmetrical flexibility.

Figure 5A:
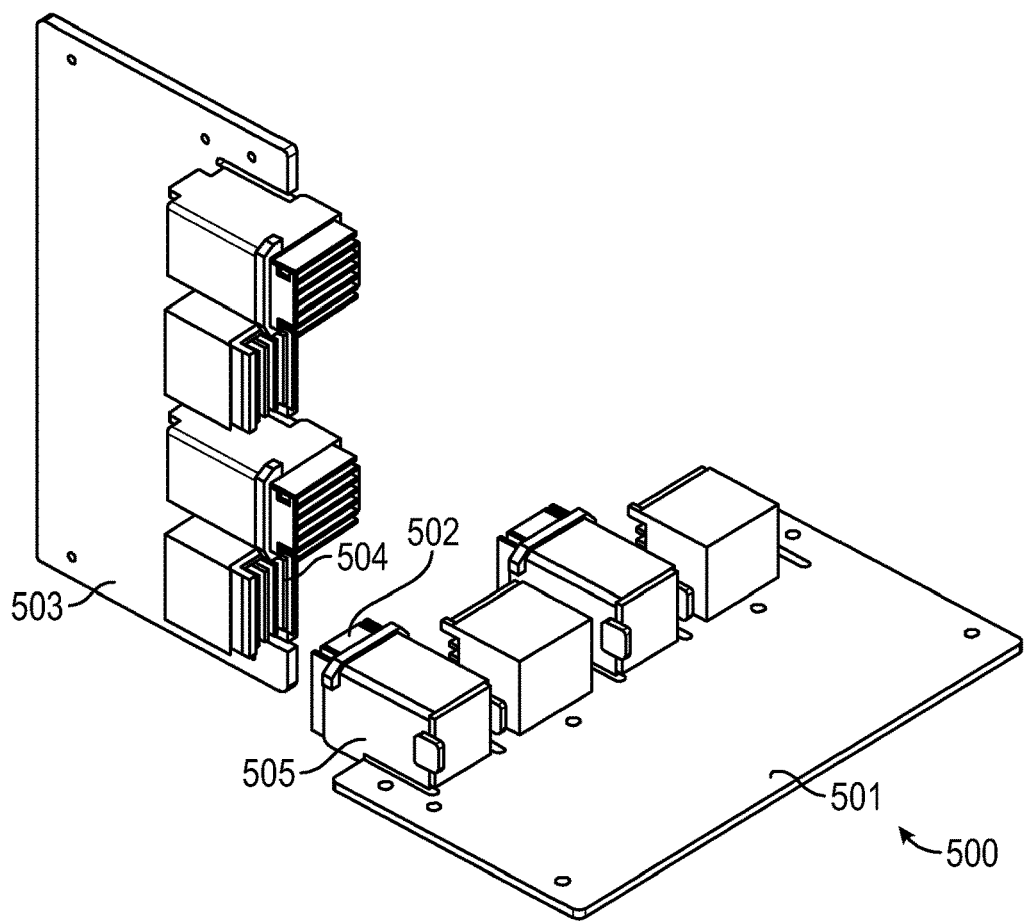
FIG. 5A is an isomorphic view of two mating computer boards to be coupled via a pass-through flexible connector, according to one or more examples of the disclosure.

FIG. 5A is an isomorphic view 500 of two mating computer boards 501 and 503 to be coupled via a pass-through flexible connector 502, according to one or more examples of the disclosure. In one example implementation, mating computer boards 501 and 502 have corresponding mating connectors 504 and 505, respectively, that are coupled together via the pass-through flexible connector 502. The pass-through flexible connector 502 in effect increases the tolerances between the pins and receptors of the mating connectors 504 and 505, as further described below with respect to FIGS. 6A-6C. In this configuration, the computer boards 501 and 503 are orthogonally positioned with respect to each other, similar to the configurations described with respect to FIGS. 2A-2B.

Figure 5B:
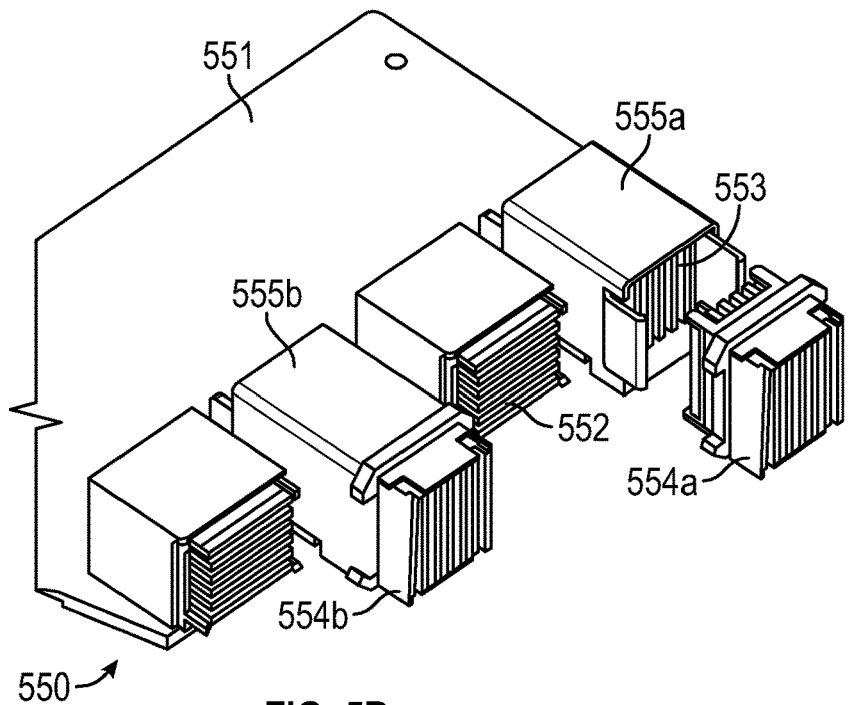
FIG. 5B is an isomorphic view of a computer board being coupled with a pass-through flexible connector, according to one or more examples of the disclosure.

FIG. 5B is an isomorphic view 550 of a computer board 551 being coupled with a pass-through flexible connector 554, according to one or more examples of the disclosure. This configuration includes connectors 552 and 553 through which computer board 551 is coupled with another mating computer board via the pass-through flexible connector 554. Plastic retainers 555a and 555b help maintain a rigid coupling between connectors directly coupled together. The retainers reduce or eliminate the need to anchor or attach connectors to rigid structural members of a computer chassis, such as chassis walls. The pass-through flexible connector 554 has two sides, one on a side facing one mating connector and the other one on the opposite side facing the other mating connector. The pass-through flexible connector 554 is coupled with one of the mating connectors first and then the computer board 551 so configured is pressed into the other mating computer board (similar to computer board 501 in FIG. 5A, not shown in this figure). This way, the pass-through flexible connector 554 allows easier alignment of pins and receptors (compared with not using the pass-through flexible connector 554) of the mating connectors.

FIG. 6A is a plan, sideview 600 of a first connector 601 and its respective pins mating a second connector 605 and its respective pins via a pass-through flexible connector 603, according to one or more examples of the disclosure. In one example implementation, the first connector 601 is plugged into the pass-through connector 603 on one side. On the other side, the pass-through connector 603 is plugged into the second connector 605, the first connector 601 and the second connector 605 being mating connectors with respect to each other. As noted before, the pass-through connector 603 effectively increases the tolerance between the first connector 601 and the second connector 605. This increased tolerance is further described with respect to the closeup views 602 and 604 below.

FIG. 6B is a closeup view 602 of the pins of the first connector 601 and the pins of the second connector 605 coupled together via the pass-through flexible connector 603 and the differences between tolerances of the first and the second connectors and the pins of the pass-through flexible connector, according to one or more examples of the disclosure. The closeup view 602 shows some of the details of the pass-through flexible connector 603. Specifically, this figure shows that the pins and/or receptors 606 on both sides of the pass-through flexible connector 603 have greater tolerance for mating, as indicated by the dotted lines. This is further described with respect to closeup view 604 in FIG. 6C.

FIG. 6C is a closeup view 604 of the expanded tolerances 610, 611, and 612 provided by the pass-through flexible connector 603 with respect to the first connector and the second connector, according to one or more examples of the disclosure. In this view, a first (or upper) tolerance boundary 607, a centerline 608 and a second (or lower) tolerance boundary 609 are shown. Mechanical tolerance is a difference in dimension between two mating mechanical components such as a pin and a socket in a connector or a piston and its enclosing cylinder in an engine. The difference in dimension between such mating components creates a gap. The gap is specified by its spatial boundaries. The tolerance boundaries 607 and 609 refer to the extent of the gap between pins and receptors of the coupled connectors.

In one example implementation, the tolerance boundaries 607 and 609 are a predetermined distance, such as 0.003 inches, away from the centerline 608, in opposite directions. The predetermined distance may be a tolerance between the pins and receptors of the two mating connectors 601 and 605 without using the pass-through flexible connector 603. The first tolerance boundary 607 is on one side of the centerline 608, while the second tolerance boundary 609 is on the opposite side of the centerline 608, as shown in the figure. This way, the overall expanded tolerance 611 between the first tolerance boundary 607 and the second tolerance boundary 609 is effectively double the tolerance between the pins and receptors of the two mating connectors 601 and 605 without the pass-through flexible connector 603. This increased tolerance provided by the pass-through flexible connector 603 makes it easier to align the pins and receptors of the two mating connectors 601 and 605.

Figure 7:
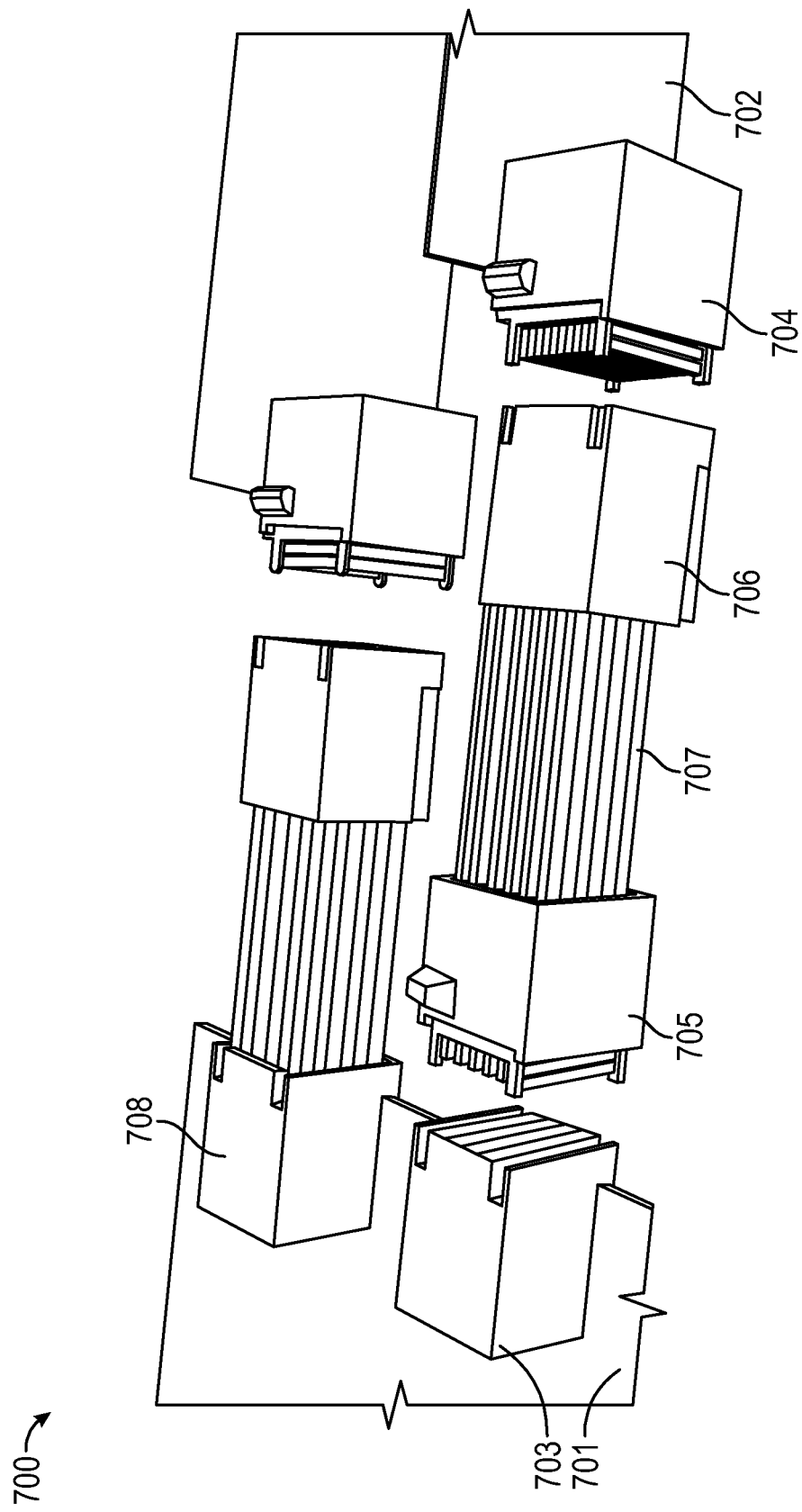
FIG. 7 shows a configuration with a first connector being coupled to a second connector via a cable-based flexible connector, according to one or more examples of the disclosure.

FIG. 7 shows a configuration 700 of a first connector 703 being coupled to a second connector 704 via a cable-based flexible connector assembly, according to one or more examples of the disclosure. In this configuration, the cable-based connector assembly may have a first connector 705 attached to a computer board 701, a second connector 706 attached to a mating computer board 702, and a cable bundle 707 connecting the first and second connectors 705 and 706, respectively.

In an example implementation, the cable-based flexible connector assembly introduces flexibility in the connection between the mating computer boards using the flexible cable bundle 707. It also allows each of the mating connector pairs 705 and 706 on the mating computer boards 701 and 702, respectively, to be coupled individually, rather than all connector pairs at once. This reduces the need for simultaneous alignment of multiple connector pairs between the mating boards. As shown in FIG. 3D, the cable bundle may be wrapped in a protective shield or wrap 369 to protect the cables from physical wear, sagging, or becoming tangled. The protective shield may further provide some level of rigidity to avoid undue movements by loose cables during coupling.

In another example implementation, an integrated connector 708 replaces connectors 703 and 704, hence reducing the overall length of the cable-based flexible connector assembly and saving space, improving signal integrity due to reduced length of signal path and fewer contact points that usually degrade electrical signals, and increasing reliability of the coupling between two mating connectors 703 and 704. In this configuration, the cable-based flexible connector assembly is permanently attached to one computer board 701 and the other end is available to be flexibly coupled with a mating connector on a mating computer board 702.

In an example implementation, the cable-based flexible connector assembly may be permanently attached to every other connector 708 on the computer board 701. This way, two mating computer boards have a cable-based flexible connector assembly on every other connector 708 on each of the mating computer boards that allows the connectors 708 to be assembled closer to each other and increase spatial density and reduce the size of the mating computer boards. This arrangement also creates a configuration symmetry that allows a single board type and configuration to be used in every slot in the computer chassis 100, regardless of orientation, up, down, left, or right with respect to other adjacent or mating computer boards. This is because half of the cable-based flexible connector assembly are placed on every other connector 708 on each mating computer board and together all connectors on all mating computer boards are coupled with a cable-based flexible connector assembly.

The foregoing description, for purposes of explanation, used specific nomenclature to provide a thorough understanding of the disclosure. However, it will be apparent to one skilled in the art that the specific details are not required in order to practice the systems and methods described herein. The foregoing descriptions of specific examples are presented for purposes of illustration and description. They are not intended to be exhaustive of or to limit this disclosure to the precise forms described. Obviously, many modifications and variations are possible in view of the above teachings. The examples are shown and described in order to best explain the principles of this disclosure and practical applications, to thereby enable others skilled in the art to best utilize this disclosure and various examples with various modifications as are suited to the particular use contemplated. It is intended that the scope of this disclosure be defined by the claims and their equivalents below.

What is claimed is:

1. A computer board, comprising:
a base printed circuit board (PCB) having a plurality of flexible tabs created within the base PCB, each of the plurality of flexible tabs being separated from the base PCB with a slot on either side to allow each of the plurality of flexible tabs to deflect relative to the base PCB under connector coupling insertion force, wherein a respective flexible tab comprises a milled portion that connects the flexible tab to the base PCB and is thinner than the base PCB; and
a plurality of high-count connectors attached to the plurality of flexible tabs, wherein the high-count connectors are configured to deflect with the plurality of flexible tabs to allow simultaneous alignment of pins and receptors of the plurality of connectors with receptors and pins, respectively, of a plurality of mating high-count connectors.

2. The computer board of claim 1, wherein the milled portion is on a same surface of the base PCB as a surface on which each of the plurality of high-count connectors are attached to the base PCB.

3. The computer board of claim 1, wherein the milled portion is on an opposite surface of the base PCB from a surface on which each of the plurality of high-count connectors are attached to the base PCB.

4. The computer board of claim 1, further comprising a second milled portion on each of the plurality of flexible tabs to increase flexibility on the respective tab, each of the first and second milled portions being on a different surface of the base PCB.

5. The computer board of claim 1, further comprising power and ground traces and signal traces embedded in the base PCB, the power and ground traces and signal traces being routed around the milled portion of each of the plurality of flexible tabs.

6. The computer board of claim 1, the computer board being usable in a computer chassis, the computer chassis having a vertical section being orthogonal to a horizontal section, and the computer board being usable in both the vertical section and the horizontal section.

7. The computer board of claim 6, wherein the plurality of high-count connectors are arranged on the plurality of flexible tabs as alternating male and female connectors, thereby facilitating coupling between a first computer board used in the vertical section and a second computer board used in the horizontal section.

8. The computer board of claim 1, having all of the plurality of high-count connectors on a same surface of the base PCB.

9. The computer board of claim 8, having a flat surface opposite the surface on which the plurality of high-count connectors are deployed, and being usable with another computer board of a same type with the respective flat surfaces of both computer boards placed adjacent together in a computer chassis to increase connector density in the computer chassis.

10. A computer board, comprising:
a base printed circuit board (PCB);
a plurality of high-count connectors attached to a first surface of the base PCB; and
a pass-through flexible connector to couple each of the high-count connectors to each of a plurality of corresponding mating connectors and increase flexibility to allow simultaneous alignment of all pins and receptors of each of the plurality of high-count connectors and each of the plurality of corresponding mating connectors;
wherein the plurality of high-count connectors are arranged on the first surface of the base PCB as alternating pins and receptors, thereby facilitating coupling between the computer board and a second computer board of a different orientation.

11. The computer board of claim 10, further comprising a plurality of plastic retainers enclosing each of the plurality of pass-through flexible connectors to retain the coupling between each of the plurality of high-count connectors and each of the plurality of corresponding mating connectors.

12. The computer board of claim 11, each of the plurality of plastic retainers enclosing every other one of each of the plurality of high-count connectors and each of the plurality of corresponding mating connectors.

13. The computer board of claim 10, the pass-through flexible connector having pins and receptors with tolerances greater than the tolerances between the pins and receptors of each of the plurality of high-count connectors and each of the plurality of corresponding mating connectors.

14. The computer board of claim 10, the base PCB having a second surface to be placed adjacent to a second surface of a base PCB of an adjacent computer board to increase spatial density of connectors in a computer chassis housing the computer board and the adjacent computer board.

15. A computer board, comprising:
a base printed circuit board (PCB);
a plurality of high-count connectors attached to a first surface of the base PCB, wherein a respective connector is attached to a flexible tab separated from the base PCB with a slot on either side, and wherein the flexible tab comprises a milled portion that connects the flexible tab to the base PCB and is thinner than the base PCB; and
a plurality of cable-based flexible connector assemblies to couple each of the high-count connectors to each of a plurality of corresponding mating connectors and increase flexibility to allow alignment of pins and receptors of each of the plurality of high-count connectors individually and each of the plurality of corresponding mating connectors individually.

16. The computer board of claim 15, wherein each of the plurality of the cable-based flexible connector assemblies is permanently attached to the computer board on one end of each of the cable-based flexible connector assemblies and constitute one of the plurality of high-count connectors.

17. The computer board of claim 16, wherein each of the plurality of the cable-based flexible connector assemblies is shorter than a cable-based flexible connector assembly unattached to the computer board.

18. The computer board of claim 15, wherein each of the plurality of the cable-based flexible connector assemblies has a protective wrap around a cable section of each of the plurality of the cable-based flexible connector assembly to prevent cables from sagging.

19. The computer board of claim 15, wherein each of the plurality of the cable-based flexible connector assemblies is attached to every other of each of the plurality of high-count connectors.

20. The computer board of claim 15, wherein the plurality of high-count connectors are arranged on a surface of the base PCB as alternating pins and receptors, thereby facilitating coupling between the computer board and a second computer board of a different orientation.

* * * * *